US006854083B2

(12) United States Patent
La Rosa

(10) Patent No.: US 6,854,083 B2
(45) Date of Patent: Feb. 8, 2005

(54) EEPROM MEMORY INCLUDING AN ERROR CORRECTION SYSTEM

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 463 days.

(21) Appl. No.: 09/859,207

(22) Filed: May 16, 2001

(65) Prior Publication Data

US 2002/0013876 A1 Jan. 31, 2002

(30) Foreign Application Priority Data

May 17, 2000 (FR) .......................................... 00 06254

(51) Int. Cl.[7] .............................................. G11C 29/00
(52) U.S. Cl. ................................. 714/763; 365/189.05
(58) Field of Search ............................ 714/763; 711/1, 711/103; 365/189.05, 230.08

(56) References Cited

U.S. PATENT DOCUMENTS

| 4,559,619 A | * | 12/1985 | Ikeda ......................... 365/190 |
| 5,029,134 A | * | 7/1991 | Watanabe .............. 365/189.05 |
| 5,448,578 A |   | 9/1995 | Kim |
| 5,765,185 A |   | 6/1998 | Lambrache et al. ........ 711/103 |
| 5,896,316 A | * | 4/1999 | Toyoda ................... 365/185.02 |
| 5,978,262 A | * | 11/1999 | Marquot et al. ....... 365/189.05 |

OTHER PUBLICATIONS

Patent abstracts of Japan, vol. 2000, No. 02; Publication No. 11328981 dated Nov. 30, 1999 entitled "Semiconductor Memory and Regulator". Applicant: Matsushita Electric IND Co. Ltd.

* cited by examiner

*Primary Examiner*—Guy J. Lamarre
(74) *Attorney, Agent, or Firm*—Lisa K. Jorgenson; Allen, Dyer, Doppelt, Milbrath & Gilchrist, P.A.

(57) ABSTRACT

An electrically erasable and programmable memory includes a memory array having memory cells connected to word lines and bit lines. The bit lines are arranged in columns. The memory also includes read circuits connected to the bit lines and programming latches connecting the bit lines to a programming line. The memory includes a device to break the conductive paths connecting the memory cells of a column to the read circuits when data has been loaded into the latches of the column, without breaking the conductive paths that connect the latches of the column to the read circuits.

18 Claims, 3 Drawing Sheets

EEPROM MEMORY INCLUDING AN ERROR CORRECTION SYSTEM

FIELD OF THE INVENTION

The present invention relates to electrically erasable and programmable memories, and, more particularly, to page-programmable EEPROM memories with an error correction system.

BACKGROUND OF THE INVENTION

In EEPROM memories, the value of a bit stored in the memory cell is represented by the value of the threshold voltage of a floating-gate transistor which may be modified at will by erasing or programming operations. The programming or erasure of a floating-gate transistor includes the injection or extraction of electrical charges into the gate of the transistor by tunnel effect (Fowler-Nordheim effect) using a programming/erasure high voltage Vpp in the range of 10 to 20 volts.

The reading of a memory cell having a floating-gate transistor includes comparing the threshold voltage Vt of the transistor with a reference voltage Vt0 that is substantially in the middle between the negative threshold voltage of a programmed transistor and the positive threshold voltage of an erased transistor. In practice, this comparison is made by the application, to the transistor gate, of a read voltage Vread that is substantially equal to Vt0 and then by observing whether the transistor is on or off. The on state or off state of the transistor is detected by a read circuit generally called a read amplifier (or "sense amplifier"), connected to the bit line to which the floating-gate transistor is itself connected. During the reading process, an erased transistor remains off because its threshold voltage is higher than Vread. No current flows in the bit line and this corresponds by convention to a bit equal to 0 at output of the read circuit (certain memories use an opposite convention). A programmed transistor on the contrary is On because its threshold voltage is below Vread. A current flows in the bit line and this corresponds by convention to a bit equal to 1 at output of the read circuit.

It is assumed that the threshold voltage Vt of the transistor will remain stable in time, normally for several years, under specified conditions of temperature and use. In other words, the electrical charges injected into the gate of the transistor remain indefinitely trapped therein so long as a reverse erasure operation is not performed, and the extracted electrical charges do not, in principle, return into the erased gate so long as a reverse programming operation is not performed. However, manufacturing defects may sometimes affect the stability of certain cells, occasionally leading to an error in the reading of a bit. For example, the negative threshold voltage of a programmed transistor may develop slowly towards a positive value higher than Vread. There is then data corruption so that a "0" is read in the memory instead of the initially recorded "1", or vice versa.

For this reason, the secured-type EEPROM memories are provided with an error Correction circuit that generates an error correction code, or [ECC code] ECC, before each recording of a binary word. An [ECC code] ECC of this kind is concatenated with the binary word and recorded in the memory jointly with this word. When the word is then read in the memory, the [ECC code] ECC that accompanies it makes it possible to detect the presence, if any, of an erroneous bit in the word and to correct the bit.

The drawback of a secured memory, is that, for a given storage capacity, it requires a number of memory cells that is appreciably greater than that of a non-secured memory because a portion of the memory cells is reserved for the storage of the [ECC code] ECC bits. To reduce the ratio between the number of veils designed for the storage of the [EEC codes] ECC and the number of cells receiving data bits, it is advantageous to associate an [ECC code] ECC with several binary words rather than to associate one [ECC code] ECC with each binary word. Thus, for example, a Hamming code used to detect and correct a wrong bit in a bit string must include:

- at least 4 bits for a string of 8 bits giving a total of 12 bits to be recorded in the memory and a rate of occupation of memory space by code bits equal to about 33%,
- at least 5 bits for a string of 16 bits giving a rate of occupation of memory space by code bits of about 24%,
- at least 6 bits for a string of 32 bits, giving a rate of occupation of memory space by code bits of about 16%, etc.

The association of an [ECC code] ECC with a bit string comprising several concatenated binary words is thus an advantageous solution for reducing the number of code bits in a memory. However, the implementing of a method for the concatenation of binary words designed to form strings of very long bits containing an [ECC code] ECC is hardly practical in a page programmable EEPROM memory.

Indeed, in a memory of this kind, the number of programming latches must be identical to the number of bits in a page to enable the simultaneously recording of an entire page. When a specified binary address word has to be recorded within a bit string comprising other binary words and an [ECC code] ECC, it is necessary to read the complete bit string in the memory, insert the binary word therein by crushing the former word with the same address, compute a new [ECC code] ECC and insert the new [ECC code] ECC in overwriting the former [ECC code] ECC. The new bit string comprising the new binary word and the new [ECC code] ECC is then loaded into the programming latches. However, if another word of the same bit string has to be then replaced by a new word before the activation of the programming step, it is no longer possible to access the bit string if it has been loaded into the latches.

To overcame this drawback, a standard approach includes the temporary storage of the bit strings in a read and write accessible buffer register before the loading of the latches. So long as the bit strings are in the buffer register, they can be modified at will with the insertion of a new [ECC code] ECC at each modification. The drawback of this approach lies in the very existence of the buffer register which requires considerable space and makes the memory more complicated and costly to make. Thus, for example, a memory comprising pages of 128 binary words recorded in pairs of words accompanied by an [ECC code] ECC requires a buffer register capable of the storage, before the loading of latches, of the 128 binary words of the page with, in addition, the associated [ECC codes] ECC.

SUMMARY OF THE INVENTION

The present invention seeks to overcome this drawback. More particularly, the present invention is aimed at obtaining a page programmable memory structure that does not require any buffer register for the storage of a page to be recorded, providing for, however, the modification of the bit strings as many times as is necessary before the programming process is begun.

To achieve this goal, the present invention is based on the fact that the programming latches of a memory are, like the memory cells, connected to the read circuits via the bit lines. The present invention is also based on the fact that the On or Off state of a latch, considered between the connection point of a latch to a bit line and its point of connection to the programming line, is a function of data element that is loaded into the latch. The idea of the present invention is thus to use the read circuits to read the contents of the latches, by applying the memory cell reading principle to the latches. To this end, another idea of the present invention is to cut the conductive paths connecting the read circuits to the memory cells when the latches have to be read, so that the On or Off state of the memory cells does not interfere with the reading of the latches. Thus, the row of latches present in the memory may be used as a read accessible and write accessible buffer register for the storage and modification, at will, of the bit strings to be recorded before the activation of the programming process.

More specifically, the present invention provides for a memory of the type described here above, including breakable conductive paths connecting the memory cells of a column to the read circuits when data has been loaded into the latches of the column, without breaking the conductive paths that connect the latches of the column to the read circuits.

According to one embodiment, the memory comprises a switching device arranged on the bit lines between the memory array and the latches, and a controller for the switching device arranged to open the switching device of a column when data has been loaded into the latches of the column. According to one embodiment, the controller comprises a memory circuit delivering a signal to open the switching device of the column after having received a signal for loading the latches of the column.

According to one embodiment, the memory circuit is an element of a column selection circuit. According to one embodiment, the switching device of a column that is set in the open state in read mode is closed again in programming mode by a resetting signal applied to the controller. According to one embodiment, a switching device includes two parallel-connected switches, the first switch being driven by the controller, the second switch being driven by a signal providing for the closure of the second switch when the memory is in programming phase and for its opening if not.

According to one embodiment, the memory comprises symmetrically structured latches that can receive bits equal to 1 or 0 without requiring a resetting of the latches. According to one embodiment, the cells of one and the same column connected to one and the same word line comprise a bit string formed by at least two binary words and one error correction code. According to one embodiment, the memory comprises a programming and error correction circuit arranged to perform the following operations upon the reception of a word to be recorded in the memory array at a specified address: the reading in the memory array of the bit string designated by the address of the word to be recorded, the insertion of the binary word into the bit string and the computation of a new error correction code, and the loading of the new bit string into the latches of the column designated by the address of the word to be recorded.

According to one embodiment, the programming and error correction circuit is arranged to perform the following operations upon the reception of a binary word to be recorded in a bit string that has been loaded beforehand into the latches: reading the bit string loaded into the latches via the read circuits, inserting the binary word into the bit string and computing a new error correction code and loading the new bit string into the latches.

The present invention also relates to a method for the recording of the binary words into an electrically erasable and programmable memory of the type described here above, comprising the loading, into the latches of a column, of a bit string comprising at least two binary words and breaking the conductive paths connecting the memory cells of the column to the read circuits without breaking the conductive paths that connect the corresponding latches to the read circuits. The method also includes reading the bit string loaded into the latches via the read circuits, replacing a binary word by another in the bit string and loading the new bit string into the latches.

According to one embodiment, a bit string comprises an error correction code that is recomputed when a new binary word is inserted into the bit string and that is inserted into the bit string instead of the initial error correction code.

BRIEF DESCRIPTION OF THE DRAWINGS

These object, features and advantages of the present invention will be explained in greater detail in the following description of a memory structure and of the method according to the invention, with reference to the appended figures.

DETAILED DESCRIPTION OF THE PREFERRED EMBODIMENTS

Figure 1:
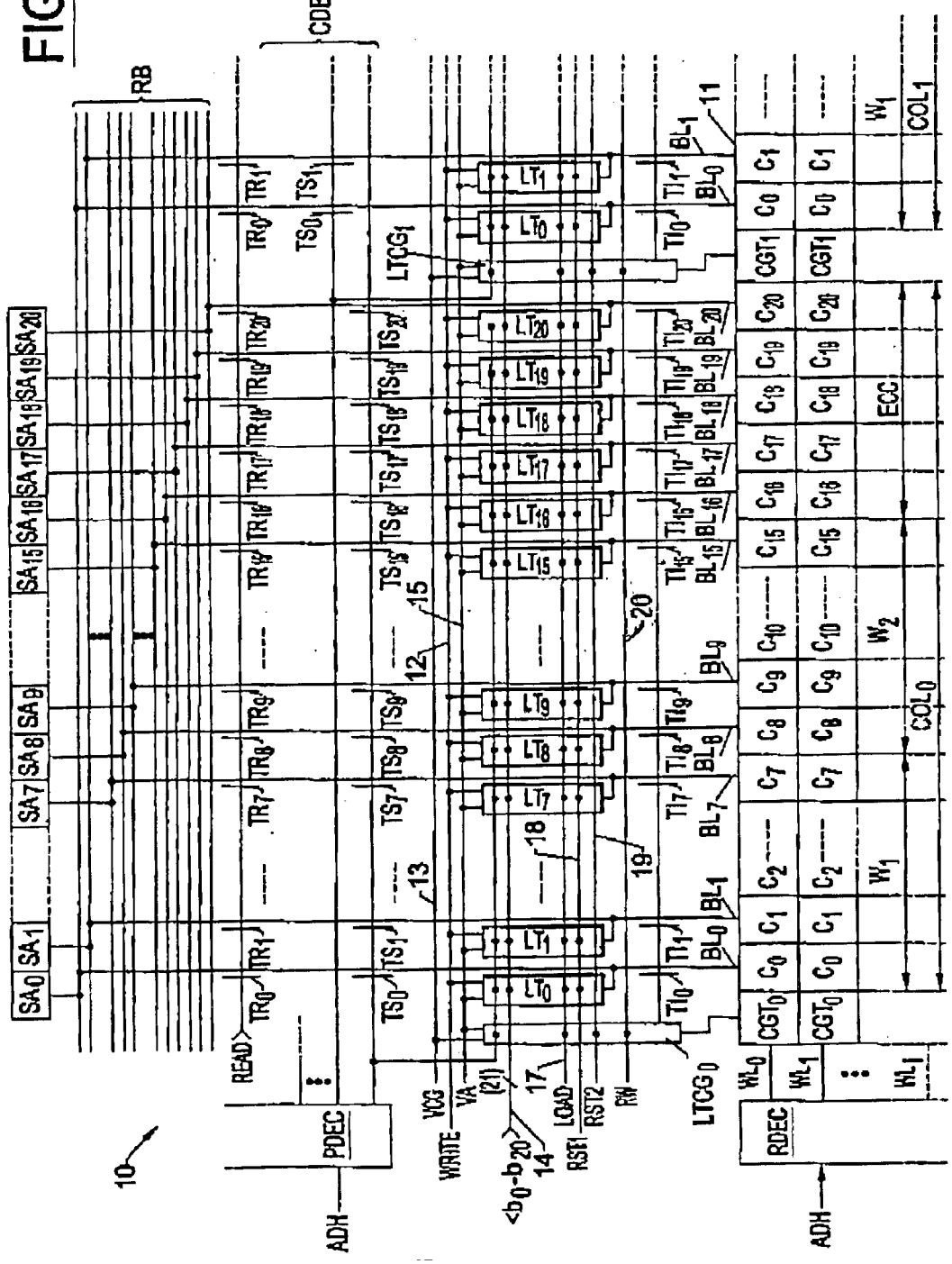
FIG. 1 is a schematic diagram showing the general architecture of a memory according to the invention.

FIG. 1 shows the structure of a page programmable EEPROM memory according to the invention. The memory 10 has a memory array 11 comprising memory cells Cj arranged in matrix form, connected to word lines WLi and bit lines BLj. The bit lines BLj are arranged in columns COLk and the memory array 11 has a repetitive structure at each new column. Each column COLk herein has 21 bit lines BL0 to BL20 and thus, in combination with a word line WLi, it defines groups of 21 cells C0 to C20 allowing the storage of 21-bit strings each comprising two 8-bit binary words (bytes) W1, W2 and an ECC or error correction code. On each word line WLi, the groups of cells C0 to C20 of each column COLk are selected via a column selection transistor $CGT_k$, or gate control transistor, schematically shown in FIG. 1. For the sake of the readability of FIG. 1, only the first column COL0 and the two first word lines WL0, WL1 of the memory array 11 are shown. Also, the cells C0 to C20 of the first column and the corresponding bit lines are not all shown.

Again, in a standard way, each bit line BLj of each column is connected to a common programming line 12 via a programming latch LTj and each transistor CGTk is connected to a gate control line 13 via a column selection circuit LTCGk. Each programming latch LTj has an input connected to a j ranking wire of a data bus 14, herein having 21 wires for the application, to the 21 latches of a column, of the bits b0 to b20 of a bit string to be recorded in the memory.

In programming mode, the common line 12 is used to apply the programming signal WRITE to the bit lines BLj whose latches LTj are in the On state, the WRITE signal formed by a programming high voltage pulse Vpp. In read, erasure or programming mode, the line 13 is used for the application, to the transistors CGTk whose latches LTCGk are in the On state, of a gate control voltage VCG used for the activation and selection of the corresponding columns.

The memory 10 also comprises 21 read circuits SA0 to SA20 ("sense amplifiers") to read the 21 bits of a bit string selected in read mode. Each bit line BLj of each column COLk is connected to a read circuit SAj of a corresponding rank via a selection transistor TSj, a read transistor TRj and a read bus RB. The bus RB provides for the interconnection of the same-ranking bit lines BLj to one and the same read circuit SAj. The selection transistors TSj (TS0 to TS20) of the bit lines of one and the same column COLk are driven by a common signal SELk delivered by a pre-decoder PDEC. The pre-decoder PDEC receives, at input, the least significant part ADL of the addresses applied to the memory 10 and, with the selection transistors TSj, forms a column decoder CDEC. Each k ranking selection signal SELk delivered by the pre-decoder PDEC is also applied to the latches LTj of a same ranking column COLk and to the selection circuits LTCGk of this column. The most significant address bits ADH of the addresses applied to the memory are applied to a row decoder RDEC whose outputs control the various word lines WLi. The read transistors TRj (TR0 to TR20) are driven by a signal READ identical for all the columns.

Thus, the conductive path connecting the memory cells Cj of a bit line BLj to a read circuit SAj conventionally comprises a selection transistor TSj and a read transistor TRj. According to the invention, the memory 10 further comprises insulation transistors TIj used as switching device and arranged on the bit lines, between the memory array 11 and the nodes for connection to the bit lines of the latches LTj. More particularly, each column COLk comprises 21 transistors TI0 to TI20 arranged on the bit line BL0 to BL20. The opening of the transistors TIj (Off state) of a column has the effect of cutting off the conductive paths connecting the cells Cj of the column to the read circuits SAj, so that only the latches LTj remain electrically connected to the read circuits SAj. According to the invention, the transistors TIj allow the use of the read circuits SAj to read data b0 to b20 loaded into the latches LTj of a selected column, as shall be described in greater detail further below.

FIG. 1 shows that the latches LTj are also connected to a line 15 through which a supply voltage VA is applied to them, a line 17 through which a loading signal LOAD is applied to them and a line 18 through which a reset signal RST1 is applied to them. The circuits LTCGk are connected to the line 15, a line 19 through which a resetting signal RST2 is applied to them and a line 20 through which a signal RW is applied to them.

Figure 2:
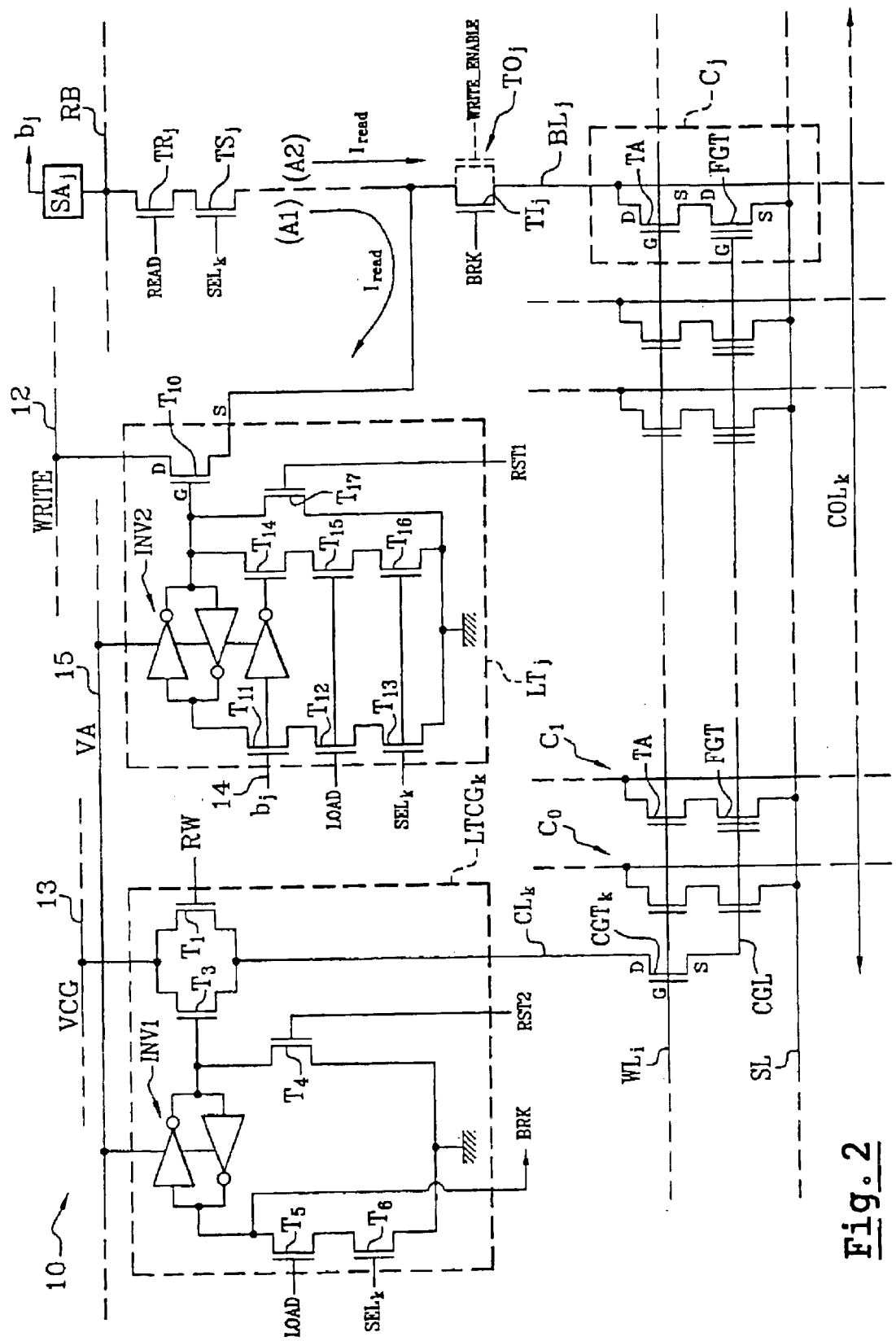
FIG. 2 is a more detailed electrical diagram of various element blocks in FIG. 1.

FIG. 2 shows a more detailed view of the structure of the memory cells Cj, programming latches LTj and circuits LTCGk. Each cell Cj conventionally has a floating-gate transistor FGT and an access transistor. The access transistor TA has its gate G connected to a word line WLi, its drain D connected to a bit line BLj and its source 3 connected to the drain D of the transistor FGT. The transistor FGT has its gate G connected to a gate control line CGL and its source S connected to a source line SL. The line CGL is common to all the transistors FGT of the cells Cj of one and the same column COLk and of a same bit line WLi to form the 21-cell groups mentioned here above. The line CGL is connected to a column selection line CLk via a gate control transistor CGTk, whose gate is connected to the word line WLi. The selection line CLk is connected to the line 13 described further above via the selection circuit LTCGk.

The circuit LTCGk connects the line 13 to the line CLk via two parallel-connected transistors T1, T3. The transistor T1 is driven by the signal RW and the transistor T3 is driven by the output of an inverter cell with memory INV1 comprising two inverter gates whose outputs are reciprocally brought to the inputs, the cell INV being electrically supplied by the voltage VA (line 15). The output of the cell INV1 is grounded via a transistor T4 driven by the resetting signal RST2. The input of the cell INV1 is grounded by two series-connected transistors T5, T6 respectively driven by the signals LOAD and SELk.

Thus, the drain D of a floating-gate transistor FGT of a memory cell Cj is connected to a read amplifier SAj via an access transistor TA, an insulation transistor TIj according to the invention, the selection transistor TSj of a column decoder CDEC and a read transistor TRj. The transistors TSj and TRj are respectively driven by the signals SELk and READ described further above and the transistor TIj is driven by a signal BRK. According to the invention, the signal BRK is herein taken at the input of the cell INV1 of the selection circuit LTCGk. The signal BRK is thus the reverse of the signal that drives the transistor T3 so that the transistor TIj is always off when the transistor T3 is on and is always on when the transistor T3 is off.

The bit line BLj is connected to a line 12 that uses a transistor T10 of the programming latch LTj to deliver the signal WRITE. The transistor T10 has its drain D connected to the line 12 and its source S connected to the bit line BLj in a node located between the insulation transistor TIj and the selection transistor TSj.

In the latch LTj, the gate of the transistor T10 is driven by an inverter cell with memory INV2 which, like the cell INV1, comprises two inverter gates connected back to front and supplied with the voltage VA. The input of the cell INV2 is connected to the ground by three series-connected transistors T11, T12, T13. The gate of the transistor T11 is connected to a wire of the data bus 14 to receive a data bit bj during a loading operation. The transistor T12 is driven by the signal LOAD and the transistor T13 is driven by the signal SELk. The output of the inverter cell INV2 is connected to the ground by three transistors T14, T15, T16. The gate of the transistor T14 is connected to the gate of the transistor T11 via an inverter gate. The transistor T15 is driven, like the transistor T12, by the signal LOAD and the transistor T16 is driven, like the transistor T13, by the signal SELk. This symmetrical structure of the latch LTj, which is an optional structure, is used for the recording at will of the bits at 0 or at 1 in the latch without requiring a resetting of the latch. The resetting of the latch is done by a transistor T17 driven by the signal RST1, connected between the output of the cell INV2 and the ground.

The operation of the memory 10 can be distinguished from that of a conventional memory by the fact that the latches LTj of a column COLk selected via a signal SELk are read accessible via the read circuit SAj when data has been loaded into the latches. During the loading step, the bits b0 to b20 are applied to the latches LTj, the voltage VA is equal to the supply voltage Vcc of the memory Vcc, a signal SELk for the selection of a k ranking column is taken to 1 and the loading signal LOAD is also taken to 1. The output of the cell INV2 of each latch LTj of the selected column COLk copies the value of the bit bj applied to the latch. The simultaneous passage to 1 of the signals LOAD and SELk causes the output of the cell INV1 in the selection circuit LTCGk to switch over to 1, so that the transistor T3 is on. At this time, the signal BRK goes to 0 and the insulation transistors TIj of the selected column are turned off, thus insulating the memory cells of the selected column of the read circuits SAj.

In practice, a step of this kind for loading the latches of a column may be applied sequentially to all or part of the columns of one and the same word line for the complete or partial loading of a page. Through the invention, the loading step may be followed by a step of reading the latches LTj via the read circuits SAj. Indeed, the output transistor T10 of each latch LTj is respectively on when a bit bj equal to 1 has been loaded into the latch and off when the bit bj equal to 0 has been loaded. The On or Off state of a latch therefore represents data loaded into the latch. Thus, the latches may be read by activating the read circuits SAj and by taking the signals SELk and READ to 1 as in the case of a standard reading of the memory. For the reading of the latches, the line 12 must be grounded. When a bit at 1 has been loaded into a latch LTj, a read current Iread goes through the transistor T10 of the latch as indicated by an arrow A1 and the output of the corresponding read circuit SAj goes to 1. If not, the output of the read circuit SAj remains at 0. The reading principle is thus the same as for the reading of the floating-gate transistors of the memory cell Cj which are herein insulated from the read circuits SAj by the transistors TIj during the reading of the latches. The latches LTj may thus be read and rewritten as desired before the activation of the process of erasing and programming the memory cells. Furthermore, the symmetrical structure of the latches enables data to be rewritten therein at 1 or at 0 without requiring any resetting of the latches via the signal RST1.

It can be noted here that the read circuits SAj do not "know" if they are reading memory cells or latches. The activation of an operation of reading a column COLk automatically leads to a reading of the latches of the column or a reading of the memory cells of the column, depending on whether data has been loaded or not into the latches. If data has not been loaded into the latches, the read current Iread flows in the selected cells Cj as indicated by an arrow A2. So that the reading may be done automatically in the memory array 11, when data has not been loaded into the latches, the signal RW applied to the selection circuits LTCGk is taken to 1 and the read voltage Vread is applied to the line 13.

With reference to the problem explained above, this possibility of reading latches offered by the present invention allows the recovery of a bit string present in the latches, the insertion therein of a new binary word, the computation of a new [ECC code] ECC and the reinjection of the bit string into the latches. A secured memory architecture using this characteristic will be described further below.

The following steps of erasure and programming of the memory cells are obtained after the final loading of the latches when data no longer has to be modified. The cells that have to receive new data are erased by applying the voltage Vpp (10 to 20 volts) to the word line WLi selected by the row decoder RDEC as well as to the programming line 13 (voltage VCG) and the supply line 15 (voltage VA), the source line SL of the floating-gate transistors FGT being connected to the ground. The voltage Vpp is found at the gates of all the transistors FGT of the columns (of the selected word line Wli) whose programming latches LTj have been loaded with data because the circuit LTCGk of these columns, which has received the signal LOAD during the loading step, is on. These transistors FGT are thus erased collectively.

At the programming step, the column selection circuits LTCGk are reset via the signal RST2 to reopen the conductive paths connecting the latches LTj to the memory cells Cjj. The latches LTj themselves are not reset because they contain the programming data. The voltage Vpp is applied to the selected word line WLi, the voltage VCG is taken to the ground, the signal RW is taken to the voltage Vcc to let through the "0" (ground) at the gates of the transistors FGT of the word line. The signal WRITE formed by a pulse of the voltage Vpp is sent. The latches in the On state (having received a bit at 1) let through the voltage Vpp up to the drain of the transistors FGT which are then programmed (with the injection of electrical charges).

The present invention can of course have several alternative embodiments. In particular, the signal BRK that opens the insulation transistors TIj of a column may be delivered by any memory cell, whether or not an inverter, whose output is taken to 0 by the combination of the signals LOAD and SELk and set at 1 by the signal RST2. The use of the cells INV1 of the column selection circuit LTCGk to generate the signal BRK has not been planned here except with a view to saving resources.

Furthermore, a variant of the present invention includes planning, in parallel with the insulation switches TIj, for closing switches TOj shown in dashes in FIG. 2. These closing switches TOj are driven by a WRITE-ENABLE signal that is set at 1 during the programming operation. In this case, it is not necessary to provide for a signal RST2 distinct from the signal RST1 to close again (turn on) the transistor TIj during the programming step. The passage of the voltage Vpp to the memory cells is herein provided by the transistors TOj and the transistors TIj can remain off. Furthermore, in this embodiment, the transistor T1 present in the circuits LTCGk may be driven by the signal READ.

Figure 3:
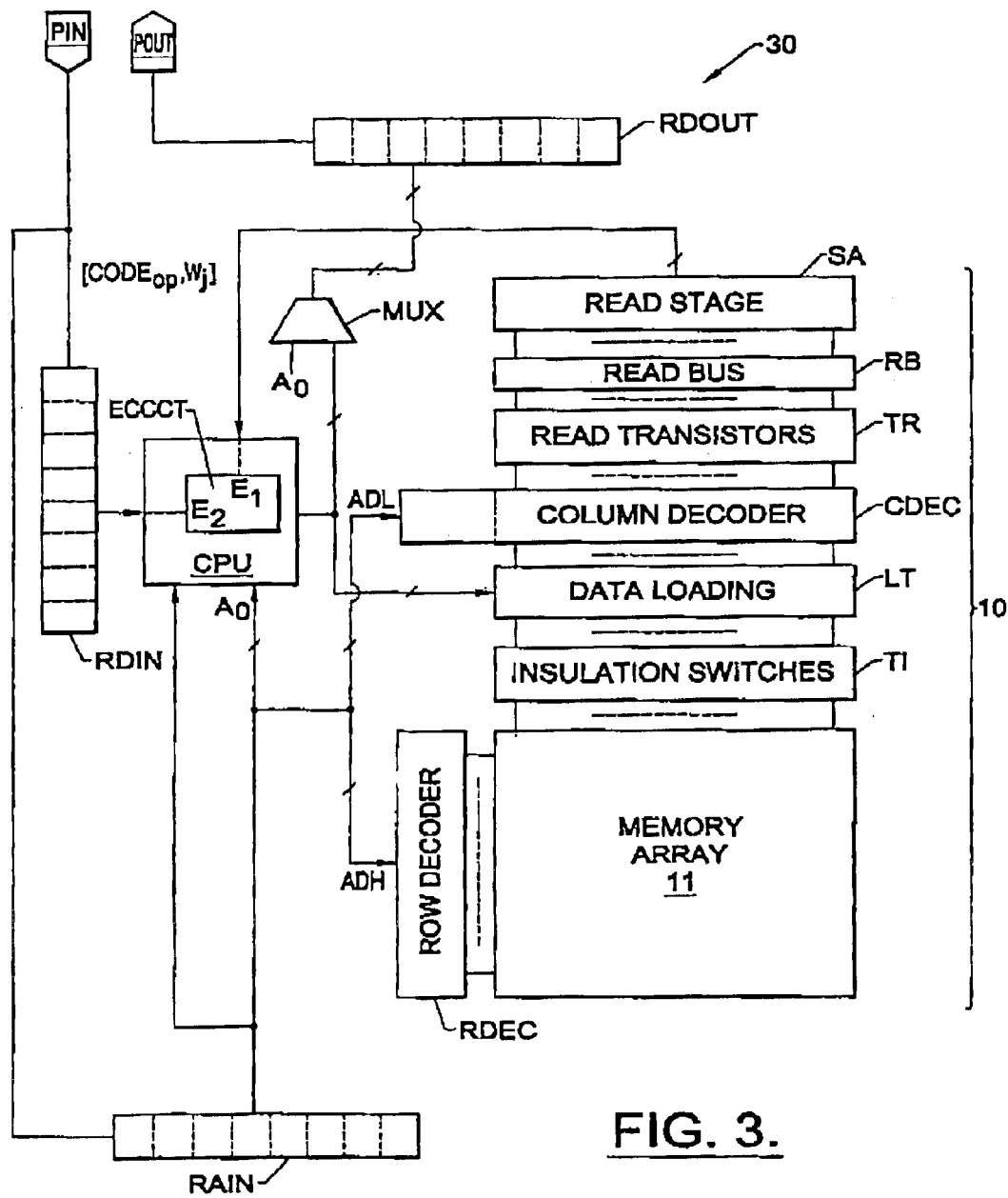
FIG. 3 is a schematic diagram showing the general architecture of a secured memory according to the invention.

FIG. 3 illustrates an application of the present invention to the making of a secured page programmable memory 30, with serial input and output. The memory 30 shown in schematic form comprises the memory structure 10 that has just been described, a central processing unit CPU, register RDIN and RAIN with serial input and parallel output and an output register RDOUT with parallel input and serial output. The central processing unit CPU has a standard type of error correction algorithm taking the form of a wired logic circuit ECCCT. This circuit ECCCT is designed to automatically correct an erroneous bit in a bit string given at its input E1 and/or generate an ECC code from a string of data bits given at its input E2. The memory 10, as described further above, has a memory array 11, a stage TI (comprising the insulation switches TIj according to the invention), a data loading stage LT (comprising the latches LTj), the column decoder CDEC, a stage TR (comprising the read transistors TRj), a read bus RB and a read stage SA (comprising the read circuits SAj). The serial inputs of the register RDIN and RAIN are connected to an input port PIN of the memory 30 and the serial output of the register RDOUT is connected to an output port POUT.

The operation codes CODEOP of the operations to be performed are received in the register RDIN and applied to the central processing unit CPU for decoding and execution. The word-recording addresses are received in the register RAIN and applied to the memory 10. More particularly, the most significant address bits ADH are applied to the row decoder RDEC and the least significant address bits ADL are applied to the column decoder CDEC except for the least significant address bit A0 applied to the unit CPU. The binary words Wj to be recorded in the memory are received in the register DRIN and are applied to the central processing unit CPU which delivers, to the input of the stage LT, strings of bits of the binary words concatenated in pairs and accompanied by an ECC error correction code. According to the invention, the central processing unit CPU uses the stage of latches LT as a read-accessible and write-accessible dynamic register to store bit strings to be recorded in the memory array 11 and to modify them if need be before the activation of the erasure and programming processes.

For example, it will be considered that the central processing unit CPU receives the following write instruction in the form of a sequence of bytes:

[CODEWRITE][ADH1][ADL1 ][W1][ADL2 ][W2][ADL3][W3]

This instruction means: "in the address word line ADH1, write the word W1 in the address column ADL1, the word W2 in the address column ADL2 and the word W3 in the address column ADL3". To highlight the advantages of the present invention, it will also be assumed that the words W1 and W3 have the same partial address, namely that the recording addresses ADL1, ADL3 of the words W1, W3 are identical, except for the bit A0. These addresses thus corresponds physically to the same bit string in the same physical column of the memory array.

After having decoded the instruction code CODEWRITE, the central processing unit CPU applies the bits A15-A8 of the address ADH1 to the decoder RDEC and the 7 most significant bits A7-A1 of the address ADL1 to the decoder CDEC, the bit A0 being not applied to the decoder CDEC. The address ADH1 (A15-A8) which designates the page (word line) will not be modified until the end of the page loading and programming process. The unit CPU then reads the word W1 received in the register RDIN and reads the bit string presented in the physical address column A7-A1 via the read circuit SA:

Wa//Wb//ECC

The central processing unit CPU then uses the code ECC to verify the validity of the bits of the string and, if necessary, corrects an erroneous bit. Then, the unit CPU replaces one of the words Wa, Wb by the new word W1, the word Wa or Wb to be replaced being designated by the address bit A0. This is for example a word Wa if the bit A0 is equal to 0 (even parity address). The unit CPU computes the new [ECC' code] ECC' as a function of the bits of the words W1 and Wb and delivers a new bit string:

This new bit string is applied to the input of the stage LT and is loaded into the latches of the address column A7-A1 via the signal LOAD. The central processing unit CPU performs the same steps for the words W2 and W3. However, when these steps are achieved for the word W3 which has the same partial address A7-A1 as the word W1, the bit string delivered by the read circuit SA is not the bit string Wa//Wb//ECC present in the memory but the bit string W1//Wb//ECC' previously loaded into the latches of the column of the stage LT designated by the address A7-A1. Indeed, as seen further above, the path connecting the read circuit SA to the memory array 11 has been cut by the stage TI after the loading of the string W1//Wb//ECC' and the read circuit SA can read only the contents of the stage LT. The central processing unit CPU thus replaces the word Wb by the word W3, computes a new code ECC" and loads the new bit string into the same latches of the stage LT:

W1//W2/ECC"

The simplified example that has just been described shows that the memory 30 requires no buffer register other than the stage LT. This example also shows that the memory can work in page overflow mode, i.e. it can receive a quantity of words to be recorded in a page that is greater than the capacity of a page, in overwriting words already loaded into the stage LT with new words received (while at the same time recomputing appropriate [ECC codes] ECC) until the process of erasure and programming of the memory cells is activated.

Table 1 here below describes and summarizes the basic steps of a process of loading and programming a page according to the invention. Although the step 3 of the table refers to the "reading of a bit string in the memory", it is quite clear that, in the light of the above explanations, this reading is actually done in the latches of the column being considered if a bit string has already been loaded into these latches during a previous step.

The operation, in read mode, of the memory 30 is conventional per se. When a word Wj has to be read at a specified address, the string Wj//Wj+1//ECC designated by the partial address of the word Wj is read in the memory array, the step of verification and possible correction of error is performed by the unit CPU via the circuit ECCCT, and the unit CPU delivers the two words Wj, Wj+1. The word Wj is selected from among the two words Wj, Wj+1 via a multiplexer MUX driven by the address bit A0, and is then placed in the register RDOUT and delivered to the output port POUT in the form of serial data.

The present invention is of course applicable to the recording of bit strings comprising three, four, five or even more binary words, provided of course that the number of bit lines contained in the columns of the memory array is designed to receive such bit strings. The present invention is also applicable to various types of memory, serial access or parallel access. Furthermore, although the problem described in the introduction concerns secured memories and the insertion in secured memories of bit strings comprising concatenated binary words and an [ECC code] ECC, the present invention is also applicable to non-secured memories, for example if it is desired to carry out a verification of the words loaded into the latches LT before the activation of the erasure and programming process.

TABLE 1

(recording of a memory page)

| Step | Description of the step | Next Step |
|---|---|---|
| 1 | Reception of the most significant address bits ADH and application to the row decoder RDEC | ⇒ 2 |
| 2 | Reception of the less significant address bit ADL and application to the column decoder CDEC | ⇒ 3 |
| 3 | Reading in the memory of a bit string Wa//Wb//ECC at the partial address ADH//ADL (without the bit A0) | ⇒ 4 |
| 4 | Analysis of the bit string for error detection. Detection of an erroneous bit? | Yes⇒ 5 No⇒ 6 |
| 5 | Correction of the erroneous bit | ⇒ 6 |
| 6 | Reception and reading of a word Wc that has to be registered at the address ADH-ADL | ⇒ 7 |
| 7 | Computation of a new ECC' code from the new pair of words Wc//Wb or Wa//Wc (depending on the value of the address bit A0) | ⇒ 8 |
| 8 | Loading the bit string Wc//Wb//ECC' or Wa//Wc//ECC' into the latches LTj of the address ADL column | ⇒ 9 |
| 9 | New column address received? | Yes⇒ 2 No⇒ 10 |
| 10 | Simultaneous erasure of all the cells of the word line whose latches LT have been loaded with data | ⇒ 11 |
| 11 | Simultaneous programming of the cells in the erased columns (WRITE pulse) | END |

What is claimed is:

1. An electrically erasable and programmable memory (EEPROM) comprising:

a memory array comprising word lines and a plurality of columns of bit lines, memory cells connected to the word lines and bit lines,
read circuits connected to the memory cells via the bit lines,
a programming line, and
a plurality of programming latches each connecting one of the bit lines to the programming line;
a plurality of switches each being connected in a bit line between the memory cells and the programming latches, the switches of one column of bit lines defining a group of switches for interrupting connections between memory cells of the column and associated read circuits of the column when data has been loaded into the programming latches of the column, without interrupting connections between the programming latches of the column and the read circuits of the column; and
a plurality of memory circuits each for controlling one group of switches of one column of bit lines and providing a signal to open the switches of the group after a loading signal is received by the programming latches of the column.

2. A memory according to claim 1, further comprising a plurality of column selection circuits connected to the memory array; wherein each memory circuit is an element of one of the column selection circuits.

3. A memory according to claim 1, wherein, in a programming mode, the memory circuits, upon receiving a resetting signal, close the switches that were opened in a read mode.

4. A memory according to claim 1, wherein each switch comprises first and second parallel-connected switches, the first switch being driven by the memory circuit, the second switch being closed when the memory is in a programming mode and open if not.

5. A memory according to claim 1, wherein the programming latches comprise symmetrically structured latches that can receive bits equal to 1 or 0 without requiring a resetting of the latches.

6. A memory according to claim 1, wherein the memory cells of one column of bit lines and connected to one word line comprise a bit string formed by at least two binary words and one error correction code.

7. A memory according to claim 6, further comprising a programming and error correction circuit connected to the memory array for, upon the reception of a word to be recorded in the memory array at a specified address, reading the bit string designated by the address of the word to be recorded, inserting the word into the bit string and computing a new error correction code, and loading the new bit string into the programming latches designated by the address of the word to be record.

8. A memory according to claim 7, wherein the programming and error correction circuit, upon the reception of a word to be recorded in a bit string that has been previously loaded into the programming latches, reads the bit string loaded into the programming latches via the read circuits, inserts the binary word into the bit string and computes a new error correction code, and loads the new bit string into the programming latches.

9. An electrically erasable and programmable memory (EEPROM) comprising:
a memory array comprising
word lines and a plurality of columns of bit lines,
memory coils connected to the word lines and bit lines,
read circuits connected to the memory cells via the bit lines,
a programming line, and
a plurality of programming latches each connecting one of the bit lines to the programming line;
a plurality of switches each being connected in a bit line between the memory cells and the programming latches, the switches of one column of bit lines defining a group of switches; and
a plurality of memory circuits each for controlling one group of switches of one column of bit lines and opening the switches of the group after data has been loaded into the programming latches of the column.

10. A memory according to claim 9, further comprising a plurality of column selection circuits connected to the memory array; wherein each memory circuit is an element of one of the column selection circuits.

11. A memory according to claim 9, wherein, in a programming mode, the memory circuits, upon receiving a resetting signal, close the switches that were opened in a read mode.

12. A memory according to claim 9, wherein each switch comprises first and second parallel-connected switches, the first switch being driven by the memory circuit, the second switch being closed when the memory is in a programming mode and open if not.

13. A memory according to claim 9, wherein the programming latches comprise symmetrically structured latches that can receive bits equal to 1 or 0 without requiring a resetting of the latches.

14. A memory according to claim 9, wherein the memory cells of one column of bit lines and connected to one word line comprise a bit string formed by at least two binary words and one error correction code.

15. A memory according to claim 14, further comprising a programming and error correction circuit connected to the memory array for, upon the reception of a word to be recorded in the memory array at a specified address, reading the bit string designated by the address of the word to be recorded, inserting the word into the bit string and computing a new error correction code, and loading the new bit string into the programming latches designated by the address of the word to be recorded.

16. A memory according to claim 15, wherein the programming and error correction circuit, upon the reception of a word to be recorded in a bit string that has been previously loaded into the programming latches, reads the bit string loaded into the programming latches via the read circuits, inserts the binary word into the bit string and computes a new error correction code, and loads the new bit string into the programming latches.

17. A method for the recording of the binary words into an electrically erasable and programmable memory (EEPROM) comprising a memory array including memory cells connected to word lines and a plurality of columns of bit lines, read circuits connected to the bit lines, a plurality of programming latches each connecting one of the bit lines to a programming line, and a plurality of switches each being connected in a bit line between the memory cells and the programming latches, the switches of one column of bit lines defining a group of switches for interrupting connections between memory cells of the column and associated read circuits of the column, the method comprising:
loading, into the programming latches of one of the columns, a bit string comprising at least two binary words;

opening the switches of the associated group of switches of the column to interrupt the connection between the memory cells of the column and the read circuits of the column without interrupting the connection between the programming latches of the column and the read circuits of the column;

reading the bit string loaded into the programming latches of the column via the read circuits;

replacing one of the binary words in the bit string with another binary word to form a new bit string; and loading the new bit string into the programming latches of the column.

18. A method according to claim 17, wherein a bit string comprises an error correction code that is recomputed when the another binary word is inserted into the bit string and that is inserted into the new bit string instead of an initial error correction code.

* * * * *